US012685021B2

(12) United States Patent
Adams

(10) Patent No.: US 12,685,021 B2
(45) Date of Patent: Jul. 14, 2026

(54) COMPOSITE HYBRID INDUCTIVE LAYERED ELECTRIC GENERATOR

(71) Applicant: Richard Adams, Grass Valley, CA (US)

(72) Inventor: Richard Adams, Grass Valley, CA (US)

( * ) Notice: Subject to any disclaimer, the term of this patent is extended or adjusted under 35 U.S.C. 154(b) by 186 days.

(21) Appl. No.: 18/292,523

(22) PCT Filed: Jul. 29, 2022

(86) PCT No.: PCT/US2022/038916
§ 371 (c)(1),
(2) Date: Jan. 26, 2024

(87) PCT Pub. No.: WO2023/009843
PCT Pub. Date: Feb. 2, 2023

(65) Prior Publication Data
US 2024/0334833 A1 Oct. 3, 2024

Related U.S. Application Data

(60) Provisional application No. 63/227,348, filed on Jul. 30, 2021.

(51) Int. Cl.
*H10N 15/20* (2023.01)
*H10N 60/30* (2023.01)

(52) U.S. Cl.
CPC ............. *H10N 15/20* (2023.02); *H10N 60/30* (2023.02)

(58) Field of Classification Search
CPC .... H02N 11/002; H02N 11/008; H10N 15/20; H10N 60/30
See application file for complete search history.

(56) References Cited

U.S. PATENT DOCUMENTS 4,638,194 A * 1/1987 Keefe .................... H02K 55/00
310/52
4,650,924 A * 3/1987 Kauffman ............ H01B 7/0853
174/72 A
(Continued)

FOREIGN PATENT DOCUMENTS

| CN | 104567051 A1 | 4/2015 |
| JP | 2014088794 A | 4/2013 |
| WO | WO1995001505 A1 | 1/1995 |

OTHER PUBLICATIONS

Shane Thomas on behalf of U.S Patent Office, International Search Report of International Patent Application No. PCT/US22/38916, dated Jan. 27, 2023.
(Continued)

*Primary Examiner* — Naishadh N Desai

(57) ABSTRACT

A method and apparatus for generating electricity using a thermodynamic inductor formed from a thermodynamic conductor winding that converts heat into a dynamic magnetic field density within the winding, inducing a current in the winding, which is electric power for loads. The winding may be a composite, including a coaxial arrangement of two or more superconducting layers. The first layer has a low critical magnetic field. When the field in the thermodynamic layer increases, the layer transitions to the intermediate state, cooling from the entropy increase, and absorbing heat. Subsequently when the field decreases, the layer resumes superconductivity, increasing available energy which is used to expel the field and induce generated electricity. The second conductive layer in the winding, in electrical contact with the first, remains in the superconducting state, reducing heating. A connected capacitor provides L-C oscillations and energy storage, maintaining cyclical operation, and powers connected and dissipating loads.

15 Claims, 3 Drawing Sheets

(56)　　　　　References Cited

U.S. PATENT DOCUMENTS

| | | | | |
|---|---|---|---|---|
| 2007/0127171 A1 * | 6/2007 | Lee | .................... | H02H 9/023<br>361/19 |
| 2015/0194248 A1 * | 7/2015 | Holcomb | ............... | H01F 36/00<br>505/211 |

OTHER PUBLICATIONS

Diebner, "Meissner Effect" Published by LibreTexts online, May 18, 2020; https://eng.libretexts.org/Bookshelves/Materials_Science/Supplemental_Modules_(Materials_Science)/Magnetic_Properties/Meissner_Effect.

Markus Steiner on behalf of the European Patent Office, Search and Opinion of Application 22850378.5 mailed on Jun. 12, 2025.

* cited by examiner

Heat source
91

Heat exchanger
93

Composite Hybrid Inductive Layered Electric Generator in Cryostat
95

Cryogenic pump
97

Waste heat sink
98

Battery
94

Controllers
96

Electricity Output
92

Energy dissipating load
99

CHILE-G 100
101

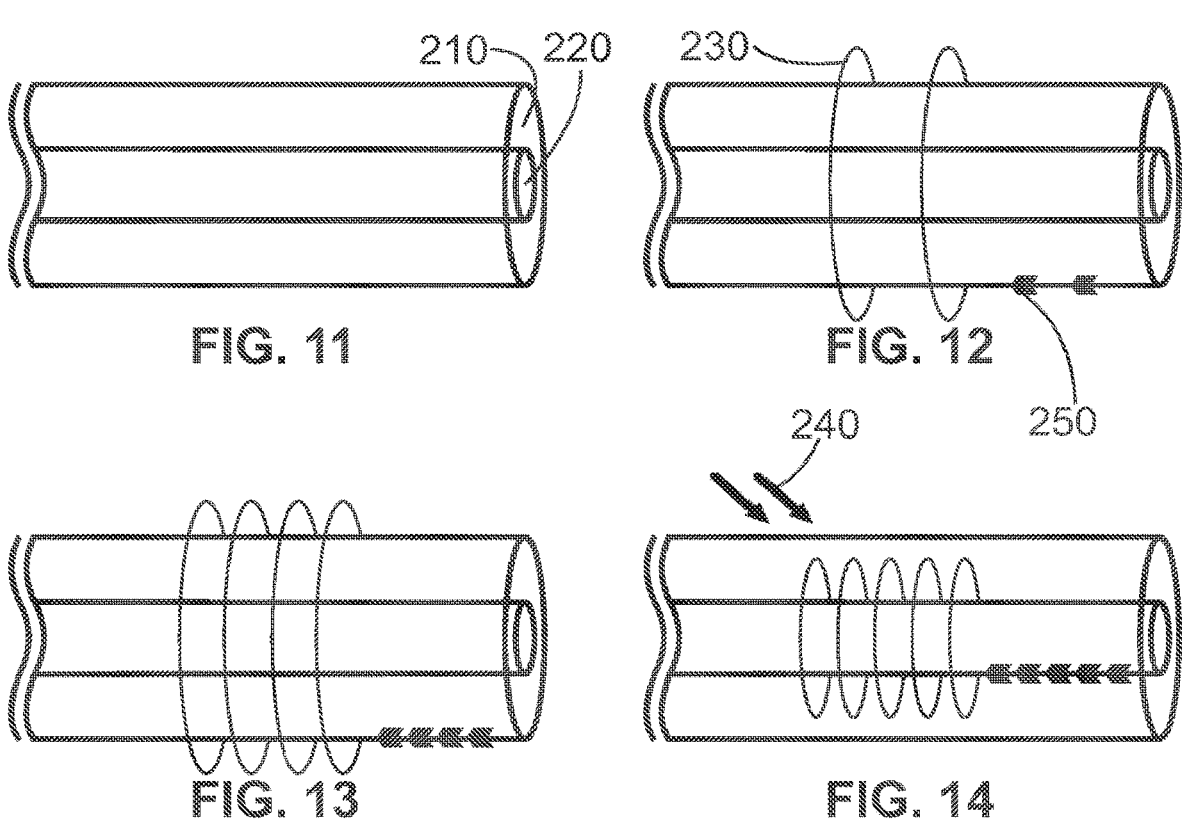
FIG. 11
FIG. 12
FIG. 13
FIG. 14
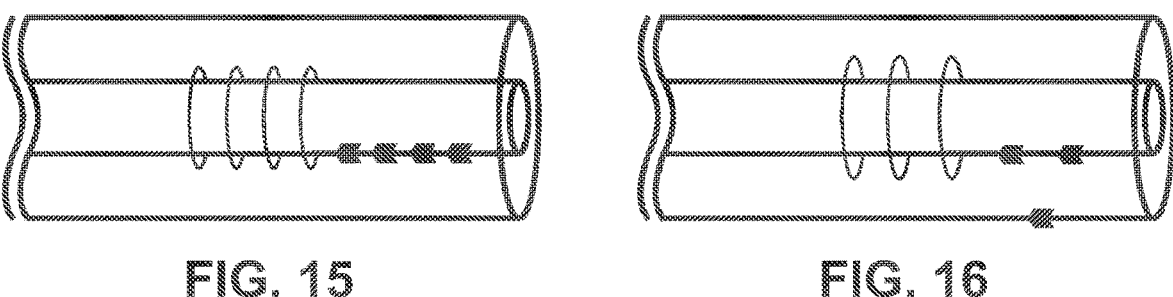
FIG. 15
FIG. 16
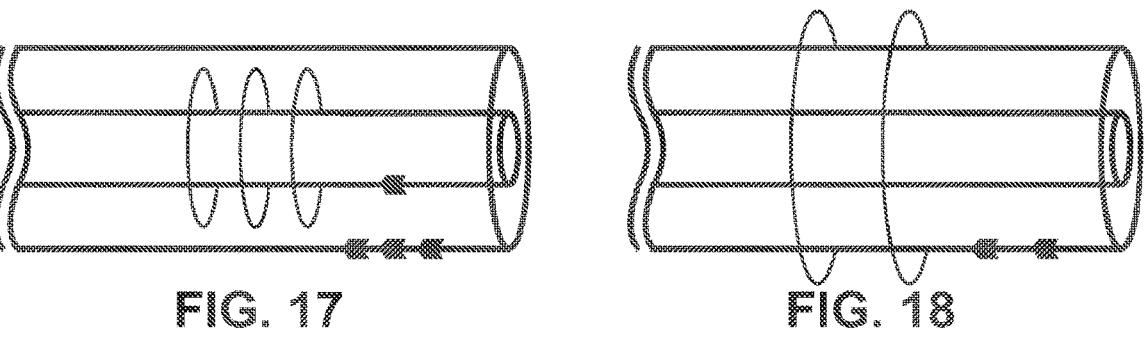
FIG. 17
FIG. 18

COMPOSITE HYBRID INDUCTIVE LAYERED ELECTRIC GENERATOR

1. CROSS-REFERENCE TO RELATED APPLICATIONS

The present patent application is based on, and claims priority from, U.S. provisional Application No. 63/227,348, entitled "Composite Hybrid Inductive Layered Electric Generator," by Richard Keith Adams, filed Jul. 30, 2021, which is incorporated herein by reference in its entirety.

2. BACKGROUND

The second law of thermodynamics is an expression of the tendency that over time, differences in temperature, pressure, and chemical potential equilibrate in an isolated physical system. From the state of thermodynamic equilibrium, the second law declares the impossibility of machines that generate usable energy from the abundant internal energy of nature by processes called perpetual motion of the second kind.

The second law of thermodynamics applies in many specific ways; for example, any system involving measurable heat transfer has some irreversible energy loss to heat. Although there have been many experiments to prove exceptions to this general rule, no device yet exists that harnesses thermal energy and converts it into electricity without loss.

3. FIELD

The present invention relates to a method and apparatus for energy conversion. More specifically, the invention relates to a method and apparatus for the cyclical conversion of energy from a heat source into electric energy.

4. RELATED ART

The following definitions are used herein:

Conductor: Comprised of an assemblage of matter that forms a volume of material with the property of conducting electric current with low loss or no loss.

Flux trapping conductor: A conductor comprised of materials with the characteristics of a Type II superconductor including low resistance and magnetic field trapping while superconducting. Flux refers to a magnetic field.

Thermodynamic conductor: A conductor comprised of materials with the characteristics of a Type I superconductor including low resistance, magnetocaloric effect, diamagnetic properties, and having a predetermined critical magnetic field, also called herein a critical magnetic field or critical field.

Winding: The part of an inductor that carries an electric current. It is a conductor of any shape, including a straight wire.

Thermodynamic Inductor: An electronic component whose conductors include a thermodynamic conductor. In addition to properties that electronic inductors are known to have, a thermodynamic inductor can also absorb heat, and generate electricity.

Combined heating: Utilizing energy to increase the temperature of a material, including for example eddy current heating, inductive heating, Joule heating, entropic heating, chemical heating and nuclear heating.

SUMMARY OF THE INVENTION

It is accordingly a primary objective of the present invention to provide a method and apparatus for the conversion of heat into electricity by combining the usage of properties including the magnetocaloric effect, diamagnetism, and electromagnetic induction.

The present invention urges an increasing and decreasing magnetic field density within a thermodynamic conductor. The thermodynamic conductor is formed into a wire and used as a winding in a thermodynamic inductor. The thermodynamic conductor is called the first conductor. When this first conductor transitions into the superconducting state, it expels the magnetic field from inside the conductor. The expulsion of the field changes the magnetic field density within the first conductor, generating an electric current in that conductor, i.e. generated electric power.

The increased free energy density of the first conductor when entering the superconducting state makes energy available to expel a magnetic field from inside the superconductor. The energy used to expel a magnetic field from inside the first conductor superconductor induces a current in the elongated length of the first conductor, which causes current to flow.

Since the first conductor is at times in the non-superconducting state and may therefore have an increased resistance, the potential exists to dissipate energy in the first conductor through combined heating.

This invention also provides a second conductor which is physically contiguous with the first conductor and electrically connected to the first conductor. This second conductor would ideally be a superconductor that remains in the superconducting state at all times, does not significantly trap magnetic fields, and has a resistance less than or equal to the resistance of the first conductor when the generator is operating. While the first conductor is resistive, electrical currents originating in the first conductor will seek the lower resistance path of the second conductor, thereby reducing combined heating in the conductors. Alternately the second conductor can be omitted by using a first conductor that has low resistance during the invention's operation.

The magnetocaloric aspect of the energy conversion objective of the present invention utilizes the property that when the critical field at a superconductor exceeds a predetermined field density, called the critical field, the field subsequently penetrates the superconductor material, making the material colder, if the cooling exceeds the combined heating that also occurs. When colder, the heat surrounding the material moves into the material. The heat that is absorbed is transferred from the heat source. This supplies energy to operate the present invention's generation of electric power.

In the present invention, the magnetic field disposed at the first conductor is increased, resulting in a magnetic field that exceeds the characteristic threshold of the predetermined critical field. While the first conductor become magnetized, the field is moving through the first conductor. In this instance, the current induced in the first conductor is not generated electricity, as the energy to produce this changing field comes from the changing current in the first and second conductors, while there is no significant positive contribution of electric energy from the first conductor during its magnetization.

This magnetocaloric aspect of the energy conversion objective prepares the first conductor to absorb energy as heat, energy that is soon after used to expel the field, and produce electricity as previously explained. Thus, the energy conversion absorbs heat and generates electricity in the cyclical oscillating steps of the two processes described above, not all at once.

Controller means described herein are used to increase and decrease the current in the windings, control the temperature of the superconducting materials, and control the energy transferred to load circuits.

It is accordingly an additional objective of the present invention to minimize the energy expenditure required to maintain the thermodynamic inductor at the required operating temperature. For superconductors, the temperature is maintained below a maximum temperature which is less than or equal to the critical temperature characteristic of the all the superconductors used in the generator that are intended to either remain in the superconductive state, or be switched in and out of the superconductive state by means other than by temperature. After cooling the initial temperature of the superconductors in the cryostat below all the critical temperatures of the superconductors, the generator tends toward colder temperatures due to the magnetocaloric effect. A heat source provides the needed replacement heat, to approximate isothermal operation over time as an average.

When a constant amount of electricity is not needed by the load circuits powered by this invention, it is an additional objective of the present invention to vary the amount of heat that is transferred to the first conductor. It is also an additional objective of the present invention to maintain the temperature of all superconductors in the thermodynamic inductor below the critical temperature, even when substantially no electricity is needed to power loads, while the present invention is active. To facilitate this, an energy dissipating load circuit is provided. The dissipater is substantially positioned so that the energy dissipated is outside the cryostat where the superconductors are placed.

An alternative to varying the amount of heat that is transferred to the first conductor, an objective of this invention is that the energy delivered to the energy dissipating load, outside the cryostat, be varied by the controller circuit.

An objective of this invention is that the energy needed to sustain the oscillation is taken as a part of the electric energy converted from the heat transferred to the first conductor. The electric energy can be provided the controller, or by mutual inductance between the first conductor winding and the other conductors, or directly from the first conductor in embodiments that have no other conductors.

Heat that enters the cryostat containing the present invention's superconductors is converted into electricity for loads, RF and heat dissipated outside the cryostat. A balance is established between the energy entering the cryostat as heat, and each form of energy leaving the cryostat. This balance maintains the superconductors below their critical temperature.

An additional objective of the present invention is to minimize the energy expense in operating the generator. This invention provides that the field sources disposed at the first conductor can be the sum of more than one magnetic field source, where an oscillating component is provided at reduced amplitude, needing less energy to produce.

A superconductor winding in the thermodynamic inductor carrying a persistent current generates a substantially constant field which by itself is less than the critical field of the first conductor. Another superconductor winding in the thermodynamic inductor carrying an oscillating current generates a field, that when summed with the other fields, the resulting total field oscillates in field density between a density that is above the critical current and below the critical current. The energy expense to produce the oscillations of the magnetic field is thereby reduced.

The present invention can be practiced minimally by using a single thermodynamic inductor, as small or large as the present art of making electronic inductors provides. Multiple generating thermodynamic inductors can be combined. The size of the thermodynamic inductors, the quantity of thermodynamic inductors, and operating cycle frequency can be increased to increase the generated electricity.

The heat source energy may be comprised of heat from a broad range of sources, including for example chemical or nuclear fuel sources, the source that produces the magnetic field that exceeds the predetermined critical field, solar energy, geothermal energy, or the heat in a compartment which is refrigerated by the present invention.

The invention is a composite hybrid inductive layered electric generator in the sense that the conductors used within the electric power generating thermodynamic inductors may be comprised of a composite and or hybrid of layered materials.

Other features, advantages and objects of the present invention will be apparent to those skilled in the art upon a reading of the specification including the accompanying drawings.

6. BRIEF DESCRIPTION OF THE DRAWINGS

The invention is better understood by reading the following Detailed Description of the Preferred Embodiments, with reference to the accompanying drawings, in which:

FIG. 1 is an electronic schematic diagram illustration that simplifies the use of the present invention, showing the thermodynamic inductor, a capacitor to control the thermodynamic inductor current by forming an L-C oscillator, an electrical load to utilize or dissipate the electricity generated, and a battery to provide current to start a generator cycle. A new schematic symbol is shown for the invention's thermodynamic inductor.

FIG. 9 is a perspective illustration of the present invention built into a cylindrical battery enclosure, to also illustrate how the heat source and energy dissipater are positioned in the application of the invention. The labeling, "CHILE-G" is an acronym for the name of the present invention, pronounced as "chilly gee."

FIG. 10 is an end view of a cylindrical hollow cryostat used to contain the thermodynamic inductor of the present invention, with the end of the cryostat removed for illustrative purposes. The thermodynamic inductor winding from FIG. 4 is enclosed in the cryostat, while a magnetic core in the hollow of the cylinder is located outside the cryostat.

Figures 1, 2, 3, 4, 5, 6, 7:
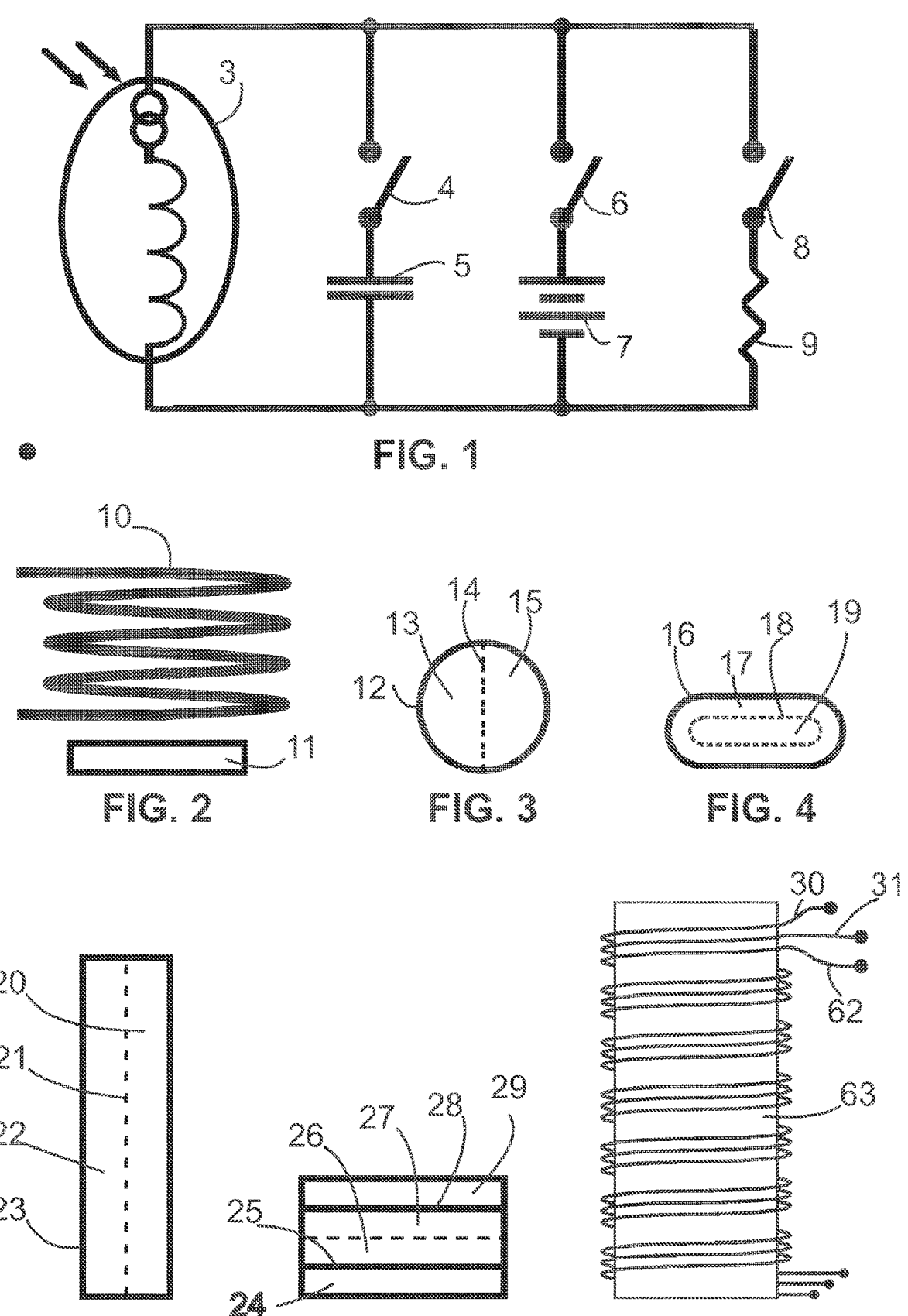
FIG. 2 is an illustration of a helical coil incorporating a composite winding of the contiguous first and second conductors that are connected together to form a single winding. A magnet is included which provides part of the magnetic field disposed.
FIG. 3 is a mid cross section illustration of the composite formed by the first and second conductors that are elongated and arranged coaxially and contiguously layered next to each other, and electrically connected to each other as a hybrid, to be used as a winding of the thermodynamic inductor.
FIG. 4 is a mid cross section illustration of the first and second conductors, elongated and arranged coaxially and contiguously layered next to each other in a concentric manner, which are electrically connected to each other as a composite or hybrid, to be used as a winding of the thermodynamic inductor. The flattened shape provides a more uniform magnetic field.
FIG. 5 is a top cross section illustration of the arrangement of conductors in FIG. 3.
FIG. 6 is a cross section illustration of the first and second conductors connected to each other, forming a conductive hybrid that is layered and sandwiched between two adjacent insulated conductive layers that provide the magnetic field.
FIG. 7 is a side view illustration of a cylindrical thermodynamic inductor where the hybrid coaxial layered wire from FIG. 3 is one of the winding conductors, while two other insulated winding conductors provide the disposed magnetic field.

FIGS. 11 through 18 are a step-by-step cycle illustrative view, each showing the same portion of the winding segment of a thermodynamic inductor in the present invention where the thermodynamic inductor has the first and second conductors arranged coaxially electrically connected contiguously, layered next to each other concentrically, with an x-ray view revealing the second conductor inside the first conductor. These eight figures illustrate the steps of cooling and electric power generation.

DETAILED DESCRIPTION OF THE PREFERRED EMBODIMENTS

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. The scale of the components used in the illustrations is comprised of a scale suitable for illustrative purposes. The actual dimensions of the components fabricated in a preferred embodiment may be comprised of a different scale.

Figure 8:
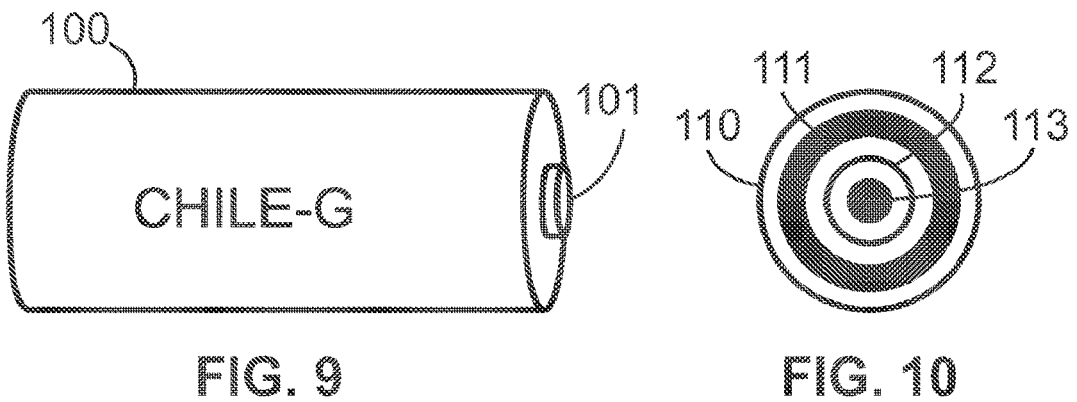
FIG. 8 is a schematic illustration of the present invention depicting the elements of the control system, heat source, sink and output.

The present invention is a composite hybrid inductive layered electric generator shown in a function block schematic diagram at FIG. 8. It combines properties of inductors and superconductor thermodynamics to absorb heat and to generate electricity using the magnetocaloric effect and electromagnetic induction.

Referring to FIG. 7, a cylindrical thermodynamic inductor form is shown, wound with a plurality of conductors comprising three insulated windings. In one embodiment, the thermodynamic inductor is formed from one conductor, in other embodiments a plurality of conductors are used. The axis of each winding follows the spiral of each conductor. The conductors are insulated with Polyimide.

The first winding 31 of FIG. 7 is the hybrid pairing, also considered to be a composite, in FIG. 3. The outer layer 12 is insulation. Two conductors are elongated, contiguous, and electrically connected by physical contact at their mating boundary 14. The first conductor 13 is elemental Lead (Pb) diameter 32 mils. The second conductor 15 is elemental Niobium (Nb), diameter 5 mils, with an overall total diameter of 37 mils. The cross section of the same hybrid conductor of FIG. 3 is shown in FIG. 5, illustrating the elongation of a segment length with a top cross section, with outer layer insulation 23, the first conductor 22 is Pb, the second conductor 20 is Nb, and the electrical connection boundary 21.

Alternately the first winding 31 can be comprised of the concentric layers FIG. 4 with the insulation 16, the first conductor 17 Pb, the second conductor 19 Nb, diameter 5 mils, the electrically connecting boundary 18. The outer diameter is 32 mils. The composite conductor assembly has been flattened to provides a more uniform magnetic field.

At the operating temperature of the generator, elemental Pb in the first conductor has a predetermined critical magnetic field, approximately 0.06 Tesla, while the second conductor Nb has a predetermined higher first critical magnetic field, approximately 0.14 Tesla. The Nb was selected as the second conductor since, even though it is a type II superconductor, it remains in the Type I superconductor mode, and does not trap magnetic fields, when the thermodynamic inductor thereby formed produces the field needed to quench the first conductor.

To utilize alternative materials, the first conductor should be one where the cooling upon quench has been verified, and the trapping of magnetic fields is quantified and minimized, such as a Type I superconductor. The second conductor may be another Type I superconductor with a higher critical magnetic field than the first conductor. A conductor which is not a superconductor, implicitly has a higher critical magnetic field, and qualifies as a second conductor. The second conductor may alternately be a Type II superconductor, However, if the field used to quench the first conductor causes a trapped magnetic field in the second conductor, the resumption of the superconductivity of the first conductor, and corresponding expulsion of a field with the generation of electricity can be delayed until the next cycle, provided that the trapped magnetic field gets demagnetized by the reversal of the field.

In one embodiment, measuring current within the flux trapping conductor can be by a current measuring circuit within the controller. The current can alternatively be predetermined by the field strength, mutual inductance, or by the actual current applied to the terminals of the flux trapping conductor from the controller.

Thus, the two interconnected first and second conductors in the composite winding constitute a continuous low resistance path for reduced energy loss, i.e. a zero resistance, since the second conductor remains in the superconducting state while the first conductor is resistive, i.e. while the first conductor is quenched.

The second and third winding 30 and 62 respectively are both insulated Nb wires, diameter 5 mils. Thus both of these are a magnet means disposed at the first conductor consisting of an insulated conductor for carrying an electric current.

Alternately, the field disposed at the first conductor can include a field stated above, but originating in full or in part from a current in the first or second conductors.

Alternately, the first, second and third windings can be comprised of a layered assembly shown as a cross section in FIG. 6, with the first winding comprised of the first conductor Pb 26 and second conductor 27 Nb, that are in contact and electrically connected. The second winding conductor 24 Nb, with insulation 25, and the third winding conductor 29 Nb with insulation 28. The layer cross sectional areas utilize the cross sectional area dimensions of the conductors described for FIG. 4 above.

Referring to FIG. 7, the Cylindrical core 63 is a metal powder with a net relative permeability of 10 while the present invention is generating electric power.

The cylinder dimensions are 0.8 inches high by 0.8 inches in diameter. The hybrid winding of contiguous conductors one and two is ten turns. The windings of each of the insulated Nb conductors is one hundred turns.

In the exemplary embodiment, at the operating temperature of 3.7 degrees Kelvin, a persistent current is of 0.9

Amps is maintained in one insulated Nb winding. The other Nb winding has an AC current of 0.09 Amps, resulting in an approximate total peak maximum field of 0.06 Tesla, and a total peak minimum field of 0.05 Tesla. The magnetic field density at the hybrid winding oscillates between the maxima and minima stated. As explained previously here, this urges the Pb in the composite/hybrid conductor to absorb heat at the maxima, and generate electricity at the minima, while the contiguous Nb, also in the hybrid winding, carries the generated electricity with zero resistance. Operating at 100 KHz, after subtracting dissipated heat and RF, the net energy converted from heat to electricity is 12 Watts of electric power to the Load 9 of FIG. 1 through switch 8. Load 9 consists of loads that comprise both useful work and dissipated energy.

The battery 7 is connected via switches 4 and 6 to provide the energy to start the first cycle of capacitor 5, and thermodynamic inductor 3.

Thus, the magnetic field means disposed is the combination of the fields produced by a current in several Nb conductive windings 30 and 62, and the magnetic field density is the stated strength of the combined field. Within the volume of the first conductor, the field density is also determined by whether the field disposed exceeds the predetermined critical magnetic field.

Thus, the magnetic field controller means is an electric circuit that produces the currents and frequencies shown above, utilizing solid-state electronic switches 4, 6 and 8. Thus, by varying the oscillating frequency, the rate of heat conversion to electricity is varied, and the quantity of electricity that is transferred out of the cryostat can be increased or decreased. Further, since the critical field changes in relation to the temperature of the superconductor, electricity delivered to the Load 9 can be increased or decreased to maintain the needed current to provide the correct critical field in relation to temperature.

Thus, there is a substantial oscillating change in entropy, magnetic field density, and free energy density in the first conductor during each cycle while the present invention is operating.

FIG. 9 is an illustrative example showing an exterior view of the present invention constructed within a self contained electric power cell. The label "CHILE-G" is an acronym for the name of the present invention. Built within this cell by the present invention and prior art are the components from FIG. 8 including Heat exchanger 93, Composite Hybrid Inductive Layered Electric Generator in Cryostat 95, Controllers 96, and Energy dissipating load 99. The positive terminal 101 of Electricity Output 92 is shown, where electric power is delivered to a load. Thus the heat source means of energy transferred into the first conductor is the Heat source 91 and the Heat exchanger 93.

Referring to FIG. 8, in preparation for operation, a temporarily attached external Cryogenic Pump 97 reduces the temperature inside the cryostat to less than 5 degrees Kelvin or colder, which is less than the critical temperature of all of the superconductors inside the cryostat, while moving the heat to external Waste heat sink 98. External Battery 94, which may be the same as 7, is temporarily connected to supply the startup energy, to initiate the oscillating magnetic field disposed at the first conductor via Controllers 96, which begins the generator cycles. After starting, the electrical generator 95 continues to covert heat into electricity. Battery 94, Cryogenic pump 97, and Waste heat sink 98 are then disconnected and no longer needed during operation, while the minimal energy to quench the first conductor is maintained in either the thermodynamic inductor 3, or capacitor 5.

During operation, while electricity is generated by the illustrative example implementation of the present invention FIG. 9, the thermally conductive exterior surface of cell 100 is part of Heat exchanger 93. An external heat source 91, comprised of any source of heat that has a higher temperature greater than the critical temperature of the first conductor, conducts heat to the exterior of cell 100, which transfers into the cell by a temperature differential, where the cell surface 100 is colder than the heat source, transferring heat to be absorbed by the first conductor within the cryostat, and converted to electricity. With the Waste heat sink 98 removed, dispersed energy that is wasted, is dispersed to the open system in the form of RF energy produced by the cyclical acceleration of electrons during the various described electric field oscillations of the present invention.

To reduce the heat produced within the cryostat, at a minimum, only the thermodynamic inductor winding of superconducting materials needs to be in the cryostat. To facilitate the use of a magnetic core with this thermodynamic inductor, the core may be placed outside the cryostat and adjacent to the cryostat by utilizing the cylindrical hollow cryostat of FIG. 10, which is depicted with an end view with one end removed to show the interior for illustrative purposes. The thermodynamic inductor windings 111 are placed between the interior surface 112 and exterior surface 110 of the cryostat. The magnetic core 113 is placed outside the cryostat, in the hollow of the cylinder.

In one embodiment, not shown, a heat source is placed inside the cryostat, such as the cylindrical hollow cryostat of FIG. 10. In one such embodiment, the heat source comprises a nuclear radioisotope. In one embodiment, the isotope is in the form of a one or more radioactive seeds having dimensions of 1 mm×5 mm, as is common for radioisotope thermoelectric generators or in medical applications. In another embodiment, the radioisotope is in a powdered form and is distributed in an enclosure forming another layer, such as the inductor windings 111 shown in FIG. 10. In some embodiments, the nuclear fuel is an alloy of at least 90% uranium-235 and the remainder molybdenum. Other isotopes can be used, depending on availability. The half-life of any chosen isotope must be sufficiently long to continue to release stable amount of energy for the life the application and it must have sufficient power density. Possible applicable isotopes include Plutonium-238, Curium-244, Strontium-90, Americium-241, and alloys of these. A salient feature of the use of the isotope in some embodiments is that it does not rely on a fission reaction, but rather uses the energy output of the isotope directly.

During operation when no load is connected, the imperfect insulation of the cryostat 95 continues to transfer heat into the cryostat. In order to maintain the temperature of the superconductors in the cryostat below their critical temperature, the present invention's electric conversion of heat to electricity continues. Referring to FIG. 8, heat that enters the cryostat 95 is converted into electricity and transferred to the Energy dissipating load 99. In one embodiment, the Energy dissipating load 99 is a resistive heater located within the cell of FIG. 9, near the surface of the cell at 100, and substantially outside the cryostat 95. Alternatively, other electric heaters that convert electricity into heat can be used in other embodiments. Thus, the energy dissipating load in this instance is a resistive heater. The net effect of the combination of heat transfer, conversion to electricity, and dissipation is that a portion of the heat from the source 91 that reaches the interior of the cryostat 95 is expelled outside the cryostat, while RF is dissipated from the electronics of the present invention when no load is connected. This maintains the operation of the cell without needing to reconnect a Cryogenic pump 97 nor Waste heat sink 98, while the cell is not in use.

Compliance with the Kelvin-Plank restatement of the Second Law of Thermodynamics is attained since there is an additional effect besides the conversion of heat to work. The other effect is the dissipation of energy as RF, explained above, a process that amounts to a loss. The dissipated RF is eventually reduced to dispersed heat in the open system, by considering the change in entropy of the whole system, entropy increases as time increases, fully in accordance with the second law of thermodynamics.

FIG. 1 is an electronic schematic diagram illustration that includes exemplary components of the present invention. The thermodynamic inductor of the present invention is assigned a new schematic diagram symbol 3, which is drawn from an inductor, a current source, and arrows indicating heat transfer. A capacitor 5 is used as both a magnetic field controller and load controller via switches 4, 6 and 8. The interconnected thermodynamic inductor and capacitor form an L-C oscillator that controls the cyclical operation of the electric generator at a resonant frequency, while the capacitor also stores energy to be used by the load circuit. The battery 7 supplies the initial energy to begin operating the electric generator, and is also used to store generated electricity.

Referring to FIG. 8, The present invention's Composite Hybrid Inductive Layered Electric Generator utilizes Controllers 96 to effect the control of the heat exchanger, the energy dissipating load, the cryogenic pump, the battery, the disposed magnetic field, the electricity output, and the current in the thermodynamic inductor. These controllers are comprised of circuits and mechanisms of the prior art using feedback, transducers, and human interfaces. Thus, the electric circuit means to transfer electric power includes electronic switches. The temperature controller means includes control of and feedback from the circuit that transfers electric power to the electric output and energy dissipating load, and is an IC with a temperature sensor therein. Thus, the energy transfer control means to transfer energy into and out of the conductors is the collection of all controllers heretofore described, and as incorporated in Controllers 96.

FIGS. 11 through 18 each illustrate the same segment of a composite coaxial concentric conductor winding in the thermodynamic inductor in the present invention. The figures show the steps for heat utilization and electricity generation. The source of the electrical current which controls this process is assumed to the connected to ends of the winding, as per FIG. 1.

The first conductor 210 is the outermost layer of the coax, which is the element lead Pb in this example. The second conductor 220 is the innermost conductor, which is the element Niobium Nb in this example. The two conductors are electrically connected to each other throughout the length of the composite conductor. For simplification, this illustration, uses a single second conductor, while the efficiency can be improved by using a multitude of second conductors that are contiguous with the first conductor.

The approximate relative location of a portion of the magnetic field is illustrated by the curves 230. The relative strength of the magnetic field is illustrated by the quantity of these curves in the particular figure. Only a portion of the field is shown, to indicate where the field is, illustrating the diamagnetic effects of conductors in each particular figure. The field strength, current strength, and field location change from one figure to the next, in consecutive order according to the figure numbers. FIGS. 11-18 form one cycle, starting at FIG. 11, and finishing at FIG. 18. The next cycle starts again at FIG. 11. In this way, the depicted process is a cyclical process.

When controlled by the capacitor 5 of FIG. 1, with switch 4 closed, the circuit is an L-C oscillator. During a particular phase, the composite conductor absorbs heat. During other phases. the composite conductor generates electricity. The direction of the current and magnetic field polarization is reversed after each cycle, making the FIGS. 11-18 one half of an L-C oscillator half cycle. Therefore as an LC oscillator, a complete cycle consists of FIGS. 11 through 18 occurring twice. The polarity of the current reverses each time the cycle begins at FIG. 11. The absorption of heat occurs in each cycle, while the polarity of generated electricity reverses. This results in an alternating current generator with an L-C oscillator forms the current controller means.

The approximate relative electrical current is shown as arrows 250. The relative strength of the electrical current from one figure to the next is represented by the total quantity of arrows in the particular figure.

At all steps in these eight figures, the second conductor 220, which is the inner conductor, remains diamagnetic, with no magnetic field penetration or trapping to the interior of the second conductor. The second conductor in these figures always expels the magnetic field, and continuously provides a low resistance or zero resistance path for an electrical current.

At FIG. 11, there is no significant applied current. Thus, no magnetic field is illustrated in that figure.

At FIG. 12, the current is increasing. The first conductor is diamagnetic, and is expelling the increasing magnetic field.

At FIG. 13, the current and corresponding magnetic field continue to increase.

At FIG. 14, the current and magnetic field have increased such that the predetermined critical magnetic field of the first conductor has been exceeded. The first conductor becomes resistive. The current seeks the lowest resistance path and now flows through the inner second conductor. The magnetic field is expelled by the diamagnetic second conductor, but has penetrated the first conductor, thereby magnetizing the first conductor. The first conductor cools, since a summation of the temperature change consisting of the entropy change, and combined heating results in a net reduction in temperature. Whereupon the temperature decreases, heat 240 is absorbed. Electricity is not generated, since unlike the magnetic field expulsion which occurs at FIGS. 16 and 17, at this magnetization step the first conductor does not have an increase in available energy.

The energy absorbed from the magnetic field that causes magnetization of the first conductor is used to increase entropy, which causes cooling and also combined heating. The cooling allows the superconductor to absorb energy in the form of heat.

To ensure cooling, the current used to dispose the magnetic field is limited to the minimum needed for magnetization of the first conductor, such that the conversion of magnetic field energy to heat is substantially minimized.

At FIG. 15, the applied current and magnetic field begin to decrease. The field continues to be expelled by the second conductor. The first conductor is still magnetized.

Characteristically, the magnetic field disposed at the first conductor must be reduced for superconductivity to resume.

The magnetic field must be reduced to a field strength that is less than the predetermined critical magnetic field by another finite predetermined Delta amount before superconductivity substantially resumes in a significant fraction of the conductor.

For example, let the predetermined critical field of the first conductor equal B. Then, when the magnetic field disposed at the first conductor increases greater than B, the first conductor substantially quenches and is magnetized, as in FIG. 14. Superconductivity does not substantially resume until the magnetic field disposed at the first conductor decreases to B minus the predetermined Delta, an observed gap.

Some of the literature about superconductors refers to the herein predetermined Delta as being Hysteresis in the critical magnetic field or critical current. That usage of the word Hysteresis is avoided here. The word Hysteresis has several definitions including a specific meaning describing the indefinite magnetic field retention of ferromagnetic materials. That's usually not the case for the thermodynamic conductor used in this example for the first conductor. As the usage of the word Hysteresis for the ferromagnetic definition also involves magnetism, but magnetism is not indefinitely retained or ferromagnetic by the first conductor, the word Hysteresis isn't as clear as the explanation here, and is therefore avoided. Here this property is referred to as a predetermined Delta.

In FIG. 16, the magnetic field produced by the current has decreased to less than B minus the predetermined Delta discussed in the previous paragraph, such that a significant fraction of the first conductor is beginning to resume superconductivity, and is starting to expel the magnetic field. The expulsion of the magnetic field within the first conductor results in the magnetic field decreasing in the first conductor.

A changing magnetic field in a conductor produces electricity. At the same time, that the expulsion of the field reduces the magnetic field in the first conductor, the reduction in the current in the conductors also reduces the magnetic field.

The additional reduction in the magnetic field, due to diamagnetic expulsion by the first conductor, utilizes the increasing available energy of the first conductor while it is resuming the superconducting state. This additional changing magnetic field in the conductor results in an additional increasing current in the conductor(s). This current opposes the decreasing magnetic field. This additional increasing current is the electricity generated by this invention. Some of the generated electricity may flow in the first conductor, since the first conductor is now resuming superconductivity.

Reiterating, the energy which drives the expulsion and electric power generation comes from the increased free (available) energy of the first conductor, that is resuming its superconductive state during this step of the cycle being described herewith. This is not the reverse of the energy utilized at FIG. 14, since at FIG. 14, the energy absorbed from the magnetic field was used to increase entropy and produce cooling. The cooling allowed the superconductor to absorb energy in the form of heat. The heating temperature change upon resumption of superconductivity is less than the cooling temperature change upon quench, since heat conduction is observed to be reduced in the superconducting state.

The Load 9 of FIG. 1 then utilizes the generated electricity through switch 8.

The magnetic field expulsion and electricity generation, which began in FIG. 16, continues in FIG. 17.

At FIG. 18, the magnetic field expulsion is complete. The current through the composite conductor continues to decrease. The first conductor is now fully diamagnetic, and the magnetic field is now expelled from, and thereby no longer changing within the interior of the first conductor. The increasing current of generated electricity ceases.

After the cycle step of FIG. 18, the current and field continue to reduce to zero, which begins the cycle again with FIG. 11.

Though not illustrated, at each cycle step where the current in the conductor is changing, RF is dispersed from the conductor, representing a loss of energy and net operational efficiency less than unity.

The discussion here, illustrating a cycle of the energy conversion process, was simplified to introduce the concept of using a second conductor that is contiguous with and electrically connected to a first conductor, together comprising a winding of a thermodynamic inductor. Additional considerations include the interaction between the field concentration due to the geometry of the design actually built, and the thermodynamic conductor's predictable relationship altering the position of the incident magnetic field, and the percentage of the thermodynamic conductor that is in the superconducting state, while the field strength is near the predetermined critical field.

In a second exemplary embodiment, the Nb winding, 30 or 62, with the persistent current of 0.9 Amps is removed and replaced with magnet 11 of FIG. 2, such that the total minimum and maximum magnetic field, other parameters besides the persistent field, and electricity generated are the same as the previous exemplary embodiment.

In a third exemplary embodiment, the hybrid winding 31 of FIG. 7 with an overall same total diameter of 37 mils is wound as an inner winding of 7 turns in 3 layers, on a non-metallic coil winding form, that is 80 mils in diameter, and 330 mils wide. The aforementioned Nb winding 30 is wound as an outer winding of 250 turns, in one embodiment, encompassing the inner winding. The outer winding is 470 mils in diameter. An oscillating peak current of 3 Amps, in the Nb winding 30, provides an oscillating magnetic field of 0.07 Tesla, at a frequency of 9 kHz, generating a net output of 2 watts. When the frequency is increased, the output power increases.

In a fourth exemplary embodiment, there is only one winding. The previously described hybrid winding 31 is flattened into an insulated ribbon wound helix 10 of FIG. 2. There are 250 turns of flat ribbon winding, one turn per layer. Each turn of the winding ribbon is 1.32 mils thick, including the insulation. The total stacked winding height is 330 mils. The oscillating peak current of 3 Amps is in the one winding, providing the disposed magnetic field. Operated at a cycle frequency of 9 Khz, 2 Watts of electricity is generated. In other embodiments, the number of turns is varied depending on the design parameters, such as the width and thickness of the ribbon wire comprising the winding. In other embodiments, the contiguous second conductor within the ribbon is positioned within the ribbon to maximize the power generated. In other embodiments, more than one contiguous second conductor is positioned within the ribbon to minimize heating.

In a fifth exemplary embodiment, the one ribbon hybrid winding of the previous exemplary embodiment is replaced with the same size non-composite, non-hybrid flattened insulated ribbon winding of Lead, without a contiguous second conductor made from a different material. In this embodiment, the Lead conductor is used to provide the disposed magnetic field, to carry current at little or no loss, and to generate electrical power.

The behavior of each turn of the insulated Lead ribbon winding is described by volume fractions. There is an inner first fraction of the volume, and an outer second fraction of the volume for each turn of the helical ribbon coil winding. The sum of the first and second volumes is approximately the total volume. The inner first fraction is the part of the volume that is quenched and not diamagnetic. The outer second fraction is the part of the volume that is still superconducting, and diamagnetic. In this embodiment it is desirable that there is an outer second fraction that is continuously superconducting, that carries the coil current with little loss or no loss. This outer second fraction of the volume, which remains in the superconducting state, takes the place of the second conductor in other embodiments. The oscillating current in the ribbon winding provides the disposed magnetic field. The magnetic field is strongest toward the inside of the coil.

During each cycle, when the current increases, the inner first fraction quenches first, and the quenched fraction increases, expanding outward. While the inner first fraction quenches, the current flows through the outer second fraction, and the magnetic field expands outward, increasing the volume of the first fraction. While the quenched first fraction volume increases and magnetic field expands, the superconducting second fraction volume, that carries the electrical current, becomes smaller.

The current is reduced prior to the entire volume being quenched. As the current is reduced, the second fraction volume increases, compressing the magnetic field inward toward the center of the helical coil, due to the resumption of superconductivity and diamagnetism in the expanding second fraction. While the field is expelled, electric power is generated. When the entire volume of a turn of the ribbon winding is superconducting, the first fractional volume is a minimum of the volume. This behavior is notably different from a copper wound inductor, since the Lead is diamagnetic in the Superconducting state, while copper is comparatively not diamagnetic. As with the previous exemplary embodiment, this one is operated at 9 Khz, generating 2 watts of electricity.

In the sixth exemplary embodiment, the Lead ribbon of the previous embodiment is replaced with a Titanium Nitride film ribbon. This provides a Type I superconductor with a higher predetermined critical field, providing an increased generating capacity per unit volume. Compared to Pb, the generating capacity increase of TiN exceeds an order of magnitude higher than that of Lead, per unit volume. A salient feature of thermodynamic ribbon coils in some embodiments is that the layer to layer surface area and spacing can be selected to have a greater influence over the self capacitance of the coils, in order to adjust the energy conversion cycle frequency, that is influenced by that capacitance.

Thus, the foregoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. For example, unless otherwise specified, steps performed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed:

1. A method of operation of a composite hybrid inductive layered electric generator to implement a cyclical process, comprising:

disposing a magnetic field at a thermodynamic conductor winding, wound into a thermodynamic inductor disposed inside a cryostat, the winding contiguous with and electrically connected to a conductor having an electrical resistance less than or equal to the winding, increasing the magnetic field above a critical field of the winding, penetrating the winding with the magnetic field, transferring heat from a heat source outside the cryostat to the winding, decreasing the magnetic field below the critical field of the winding, expelling the magnetic field from the winding, generating an electric power in the winding, transferring the electric power to a load circuit disposed substantially outside the cryostat, increasing the electric power transferred to the load circuit when an internal temperature of the cryostat is increasing, and decreasing the electric power transferred to the load circuit when the internal temperature of the cryostat is decreasing.

2. A method of operation of a composite hybrid inductive layered electric generator to implement a cyclical process, comprising:

disposing a magnetic field at a thermodynamic conductor winding, wound into a thermodynamic inductor, the winding contiguous with and electrically connected to a flux trapping conductor, increasing the magnetic field above a critical field of the winding, penetrating the winding with the magnetic field, absorbing heat in the winding, exceeding a lower critical current characteristic of the flux trapping conductor, trapping a trapped magnetic field within the flux trapping conductor, disposing a reversed polarity magnetic field at the winding, opposing the trapped magnetic field with the reversed polarity field, decreasing the magnetic field below the critical field of the winding, expelling the magnetic field from the winding, and generating an electric power in the winding.

3. A method of operation of a composite hybrid inductive layered electric generator to implement a cyclical process, comprising:

disposing a magnetic field at a thermodynamic conductor winding, wound into a thermodynamic inductor, increasing the magnetic field above a critical field of the winding, expanding the magnetic field outward, penetrating the winding with the magnetic field, absorbing heat in the winding, decreasing the magnetic field below the critical field of the winding, expelling the magnetic field from the winding, compressing the magnetic field inward, and generating electric power in the winding.

4. A method of converting heat gradients to electricity, the method comprising:

providing a thermodynamic conductor winding, providing a flux trapping conductor, generating a magnetic field above a critical field of the winding, penetrating the winding with the magnetic field, absorbing heat in the winding, measuring current within the flux trapping conductor, trapping a trapped field within the flux trapping conductor, disposing a reversed polarity magnetic field at the winding, opposing the trapped field with the reversed polarity field, decreasing the generated magnetic field below the critical field of the winding, expelling the magnetic field from the winding, and generating an electric power in the winding.

5. The method of converting heat gradients to electricity of claim 4, wherein said heat gradients comprise a difference between an ambient temperature and a temperature of the winding.

6. The method of converting heat gradients to electricity of claim 4, the thermodynamic conductor winding comprises a thermodynamic inductor.

7. The method of converting heat gradients to electricity of claim 4, wherein the measuring of current within the flux trapping conductor continues until the measurement exceeds a lower critical current characteristic of the flux trapping conductor.

8. The method of converting heat gradients to electricity of claim 4, further comprising adding a heat source.

9. The method of converting heat gradients to electricity of claim 4, further comprising a heat source which comprises a radioisotope.

10. The method of claim 1, wherein said heat source comprises a radioisotope.

11. The method of claim 1, wherein said load comprises a battery and said battery provides startup energy as well as is recharged by the generator.

12. The method of claim 1, wherein said load comprises an electric heater located within the generator.

13. The method of claim 1, excluding a cryogenic pump or waste heat sink.

14. The method of claim 2 wherein a single conductor comprises the winding, and a first fraction of a volume of each turn of the winding is adapted to be quenched while a second fraction of the volume of each turn of the winding remains in a superconducting state.

15. The method of claim 14 wherein said single conductor comprises a superconductor.

* * * * *